United States Patent [19]

Kling

[11] Patent Number: 4,853,659
[45] Date of Patent: Aug. 1, 1989

[54] PLANAR PI-NETWORK FILTER ASSEMBLY HAVING CAPACITORS FORMED ON OPPOSING SURFACES OF AN INDUCTIVE MEMBER

[75] Inventor: John P. Kling, Mt. Joy, Pa.

[73] Assignee: AMP Incorporated, Harrisburg, Pa.

[21] Appl. No.: 169,513

[22] Filed: Mar. 17, 1988

[51] Int. Cl.$^4$ .......................................... H01P 13/648
[52] U.S. Cl. ..................................... 333/184; 333/185; 361/302; 361/329; 439/607; 439/620
[58] Field of Search ................................ 333/182–185; 361/302, 328–330; 439/607, 620

[56] References Cited

U.S. PATENT DOCUMENTS

| | | | |
|---|---|---|---|
| 3,267,342 | 8/1966 | Pratt, Jr. et al. | 361/321 |
| 3,273,033 | 9/1966 | Rossmeisel | 361/329 |
| 3,483,447 | 12/1969 | Nolta et al. | 361/321 |
| 3,538,464 | 11/1970 | Walsh | 333/182 |
| 3,619,744 | 11/1971 | Stephenson | 361/321 |
| 3,784,887 | 1/1974 | Sheard | 361/305 |
| 3,878,443 | 4/1975 | Girard et al. | 361/320 |
| 3,902,102 | 8/1975 | Burn | 361/305 |
| 4,144,509 | 3/1979 | Boutros | 333/181 |
| 4,262,268 | 4/1981 | Shimada et al. | 333/182 |
| 4,407,552 | 10/1983 | Watanabe et al. | 333/182 X |
| 4,458,220 | 7/1984 | Carter et al. | 333/182 |
| 4,494,092 | 1/1985 | Griffin | 333/182 |
| 4,631,633 | 12/1986 | Saauloy et al. | 361/321 |
| 4,643,509 | 2/1987 | Hollyday et al. | 339/147 |
| 4,653,838 | 3/1987 | Ney et al. | 333/185 |
| 4,673,237 | 6/1987 | Wadsworth | 333/182 X |
| 4,679,013 | 7/1987 | Farrar et al. | 333/182 |
| 4,682,129 | 7/1987 | Bakersmans et al. | 333/184 |
| 4,690,479 | 9/1987 | Hollyday et al. | 439/97 |
| 4,733,328 | 3/1988 | Blazej | 361/320 |

OTHER PUBLICATIONS

Boutros, Kamal S.; "A New Approach to the Design of EMI Filter Connectors Using Planar Filters"; *12th Am. Connector Symposium Proceeding;* Cherry Hill, N.J.; Oct. 17/18, 1979; pp. 222–226.

Viclan New Product Bulletin No. 4A; Introducing the PCA (Planar Capacitor Array).

AMP Technical Paper No. P285, "The Use of Filters and Filtered Connectors as Applied to Motor Vehicles," E. Vander Heyden, J. Schroeder III, Harrisburg, 6/86.

AMP Catalog 78-487, "AMP Quiet Line Filter Products," Rev. 11-86, pp. 7, 63.

*Primary Examiner*—Eugene R. LaRoche
*Assistant Examiner*—Benny T. Lee
*Attorney, Agent, or Firm*—Katherine A. Nelson

[57] ABSTRACT

A planar filter assembly 12 is comprised of a generally planar inductive member 14 having upper and lower surfaces 16, 18 and a plurality of terminal receiving apertures 22 extending therethrough and a plurality of pairs of capacitors 44, 46, one capacitor pair being at respective ends of each aperture 22; whereby each the pair of capacitors 44, 46 and said inductive member therebetween forms a pi-network filter for an electrical terminal member 48 inserted into aperture 22. The capacitors 44, 46 are formed on the upper and lower surfaces 16, 18 of the inductive member by disposing a series of layers of materials on the surfaces. The first layer 24 comprises an electrically-conductive material disposed on first selected locations of upper and lower surfaces 16, 18, the first conductive coating being spaced from apertures 22 and including the ground electrode portions 25 for the capacitors 44, 46. A dielectric layer 30 is disposed on the first conductive layer 24, the dielectric layer 24 extending to the edge of the apertures 22. A second electrically conductive layer 36 is disposed on dielectric layer 30 at isolated second selected locations on the upper and lower surfaces 16, 18 to form contact pads comprising signal electrodes 38. The combination of ground electrode, portion 25 dielectric layer 30 and signal electrode forms the capacitors 44, 46 at respective ends of each aperture 22 and the combination of capacitor-inductor-capacitor forms a pi-network filter for an electrical terminal member 48 inserted into the aperture 22.

10 Claims, 3 Drawing Sheets

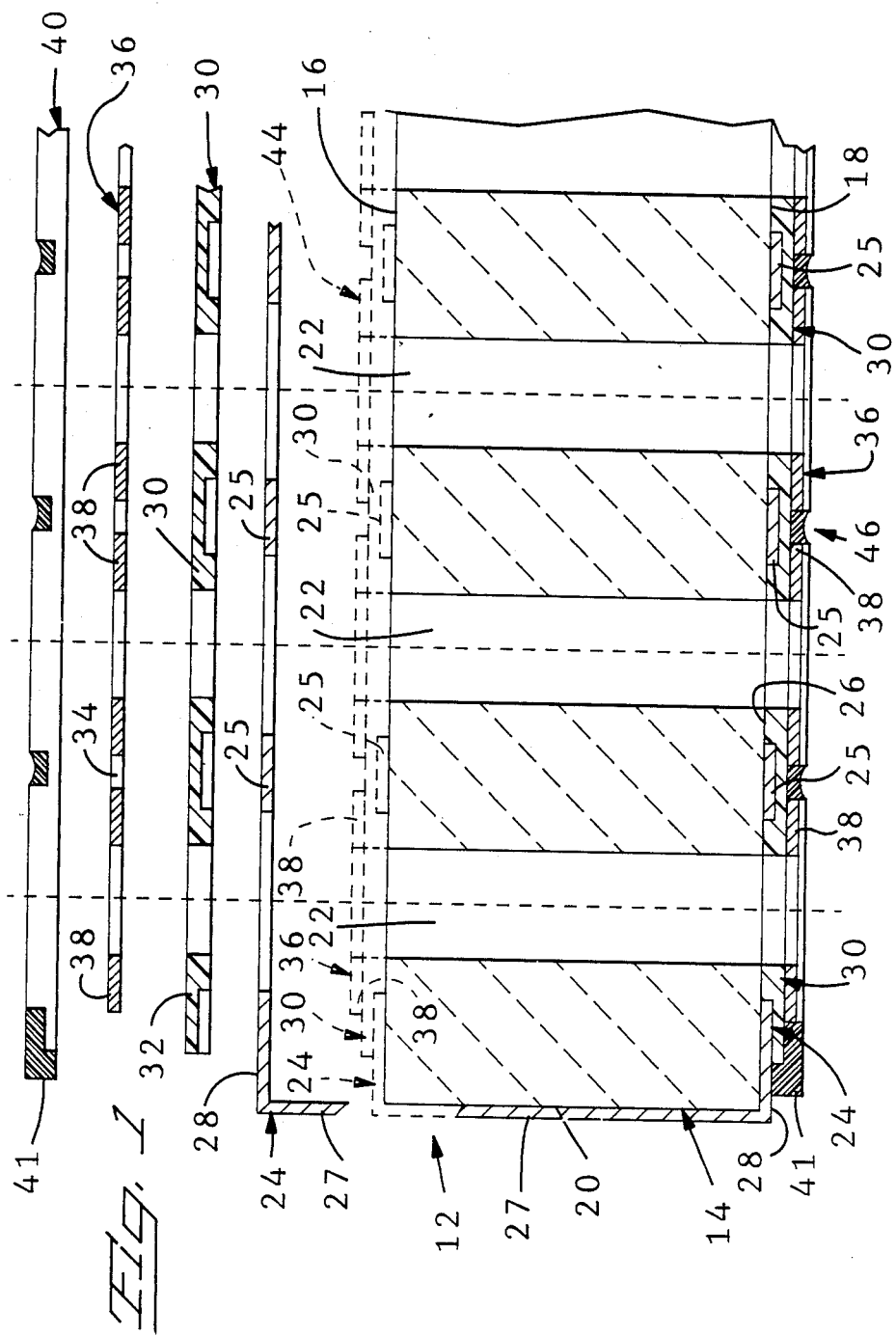

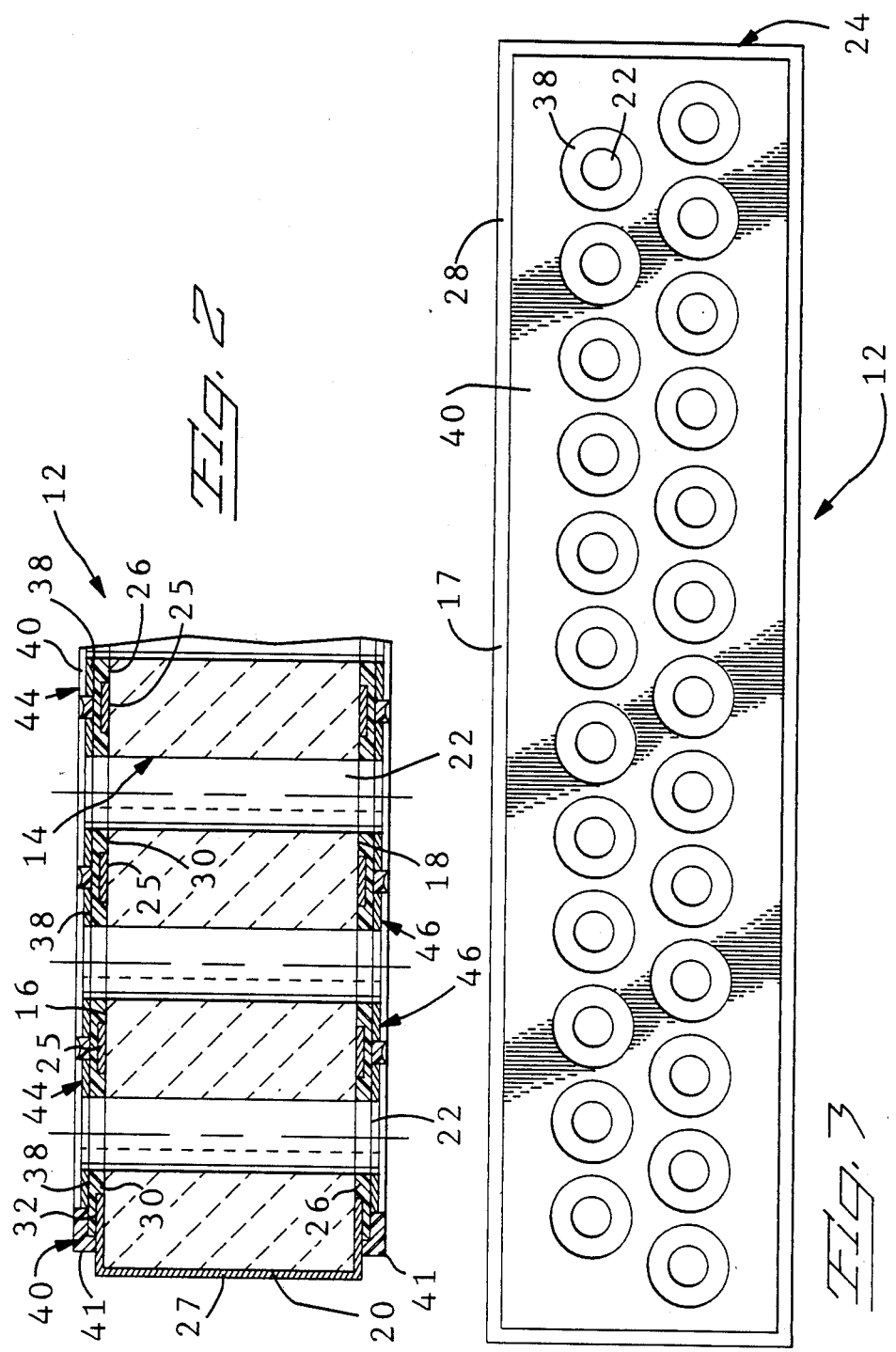

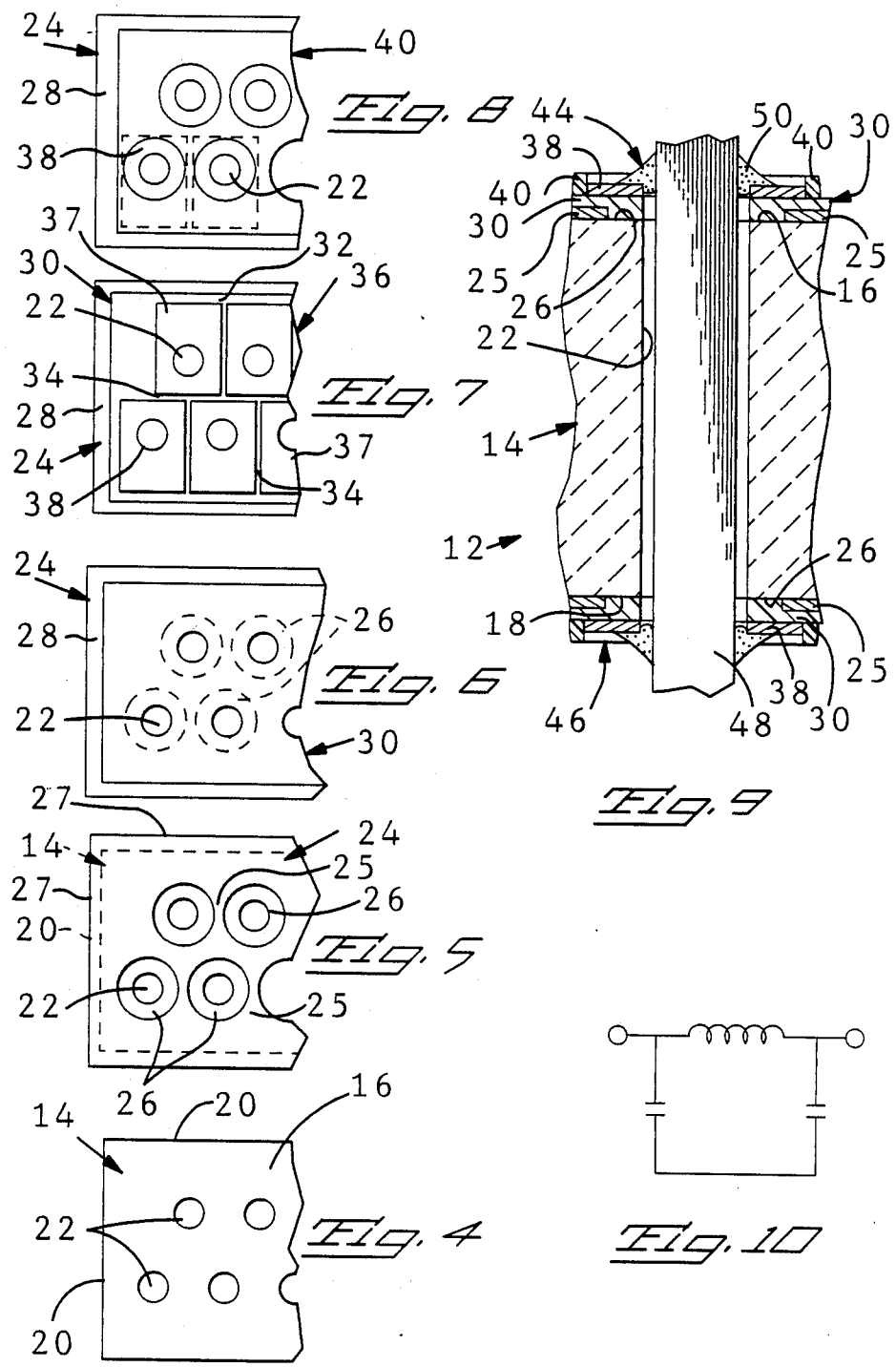

PLANAR PI-NETWORK FILTER ASSEMBLY HAVING CAPACITORS FORMED ON OPPOSING SURFACES OF AN INDUCTIVE MEMBER

FIELD OF THE INVENTION

The invention relates to filter members and more particularly to planar filter assemblies.

BACKGROUND OF THE INVENTION

Filters, particularly low pass filters, are used extensively in electrical circuits to suppress noise. For high impedance, high frequency circuits pi-network filters are generally used. The pi-network is comprised of a pair of shunt capacitors and an inductive member in series therebetween.

The elimination of high frequency noise is necessary for the transmission of signals through the input/output devices of microcomputers, for example. Both individual pi-network filters and composite pi-network filter assemblies have been used in connectors. Generally, the assemblies such as those disclosed in U.S. Pat. Nos. 4,262,268 and 4,494,092 have capacitor assemblies comprising a pair of dielectric plates having a plurality of openings formed therein for receiving individual terminals. The dielectric plates have a plurality of isolated electrodes formed on one of the opposite faces of the plates adjacent respective openings formed therein for receiving individual terminals and a common electrode formed on the other face of the dielectric plates to provide for ground return. The terminal members extend through one dielectric plate, a tubular or planar magnetic member interposed between the first dielectric plate and a second dielectric plate. The terminals are mechanically and electrically connected to the respective electrodes on each dielectric plate. The assembly also includes means for electrically connecting the common electrodes to an external circuit.

It is an object of the present invention to provide a one piece composite pi-network filter assembly as opposed to the at least three pieces for the assembly described above.

It is a further object of the invention to provide a pi-network filter assembly which can be manufactured with a minimum of fabrication steps.

In addition, it is an object of the invention to provide a high performance pi-network filter assembly.

SUMMARY OF THE INVENTION

The planar filter assembly of the present invention comprises a generally planar inductive member having upper and lower surfaces and a plurality of terminal receiving apertures extending between said surfaces; a first electrically-conductive layer disposed on first selected locations of said upper and lower surfaces, the first conductive coating being spaced from the apertures, to provide exposed upper and lower surface portions, the first conductive layer being electrically engageable with ground means; a dielectric layer disposed on the first conductive layer on said upper and lower surfaces and the dielectic extending over the exposed upper and lower surface portions of said inductive member; and a second electrically conductive layer disposed on isolated second selected locations on the said upper and lower surfaces, the second conductive layer extending to the apertures and including a conductive pad portion surrounding both ends of each respective aperture, each pad being electrically engageable with an electrical terminal member, the first conductive layer, dielectric layer and second conductive layer thus forming a plurality of pairs of capacitors, one capacitor pair being at respective ends of each aperture; whereby each pair of capacitors and said inductive member therebetween forms a pi-network filter for an electrical terminal inserted into the aperture.

The invention is further directed to a method for making a planar filter assembly comprising; selecting a generally planar inductive member having upper and lower surfaces and a plurality of terminal receiving apertures extending between said surfaces; and forming a plurality of pairs of capacitors, one capacitor pair being at respective ends of each of the apertures comprising the steps of: disposing a first electrically-conductive layer on first selected locations of said upper and lower surfaces, said first conductive coating being spaced from said apertures, to provide exposed upper and lower surface portions, said first conductive layer being electrically engageable with grounding means; disposing a dielectric layer on respective first conductive layers on the upper and lower surfaces and extending the dielectric layer over the exposed surface portions of the inductive member; and disposing a second electrically-conductive layer on isolated second selected locations on the upper and lower surfaces, the second conductive layer extending to the apertures and including a conductive pad portion surrounding both ends of each respective aperture, each unit pad being electrically engageable with an electrical terminal member; whereby each pair of capacitors and the inductive member therebetween forms a pi-network filter for an electrical terminal inserted into the aperture.

In accordance with this invention, the planar inductive member, preferably a ferrite member, having a plurality of terminal receiving apertures extending therethrough, is coated with a conductive material at selected locations on its upper and lower surfaces and along the outside edges thereof. The conductive layer on the upper and lower surfaces is spaced from locations surrounding each individual aperture. This conductive layer forms the ground electrode for the pi-network filter assembly. A layer of dielectric material is disposed over the conductive layer on both the upper and lower surfaces of the planar member. Preferably the dielectric layer is disposed over the entire surface with the exception of the peripheral edge of the planar member, thus leaving the ground conductor exposed along the outer edge of the upper and lower surfaces. Isolated areas of a second conductive layer are then disposed on the upper and lower surfaces of the dielectric layer such that isolated conductive pads are formed around each of the respective apertures, the selected areas extending outwardly toward the outermost edge of the dielectric layers on respective upper and lower surfaces. An environmental sealant material may then be disposed over the second conductive layer in all but the areas immediately surrounding the apertures. The combination of first conductive layer, dielectric layer, and second conductive layer thus forms a capacitor at respective ends of each aperture, thereby forming a pi-network assembly having capacitor-inductor-capacitor. The respective dielectric, upper and lower capacitive members, are electrically and mechanically engaged with a contact member inserted through the respective apertures and soldered or otherwise electrically connected thereto.

Some of the objects and advantages of the invention having been stated, others will appear as the description proceeds when taken in conjunction with the accompanying drawings;

BRIEF DESCRIPTION OF THE DRAWINGS

FIG. 1 is an enlarged diagrammatic cross-sectional view of the planar pi-network filter assembly with layers exploded therefrom;

FIG. 2 is an enlarged fragmentary cross-sectional view of the assembled planar filter assembly of FIG. 1;

FIG. 3 is a top plan view of the assembly of FIG. 1;

FIGS. 4-8 are top plan views of a fragmentary portion of the planar member illustrating the configurations of the layers used in making the assembly of FIG. 1;

FIG. 4 is a top plan view of the planar inductive member;

FIG. 5 is a top plan view showing the pattern of the first conductive layer disposed thereon;

FIG. 6 is a view similar to that of FIG. 5 showing the pattern of the dielectric layer;

FIG. 7 is a view similar to that of FIG. 5 showing the pattern of the second conductive layer;

FIG. 8 is a view similar to that of FIG. 5 showing the pattern of the environmental sealing material;

FIG. 9 is a cross-sectional view of the pi-network assembly illustrating a terminal member disposed in an aperture of the assembly electrically connected thereto; and FIG. 10 is an electrical schematic drawing of a pi-network filter.

DETAILED DESCRIPTION OF THE DRAWINGS

Referring now to FIGS. 1-3, planar pi-network filter assembly 12 of the present invention is comprised of a planar inductive member 14 having upper and lower surfaces 16, 18 respectively, and a plurality of terminal receiving apertures 22 extending therethrough and first and second capacitors 44, 46 formd on upper and lower surfaces 16, 18 at respective ends of apertures 22, as best seen in FIGS. 2 and 9. First or upper and second or lower capacitors 44, 46 comprising ground electrode sections 25, dielectric layer 30 and signal electrodes 38 surround respective ends of each aperture 22. Each pair of capacitors 46, 48 and the inductive member therebetween forms a pi-network filter for an electrical terminal member 48 inserted into aperture 22, as best seen in FIG. 9.

Since upper and lower capacitors 44, 46 are formed on respective upper and lower surfaces 16, 18 in the same manner, the process will be described by referring to top plan views of successive layers disposed on upper surface 16 only as shown sequentially in FIGS. 4-8 and in cross-section in FIG. 1. FIG. 1 illustrates an exploded view of an already assembled filter assembly 12 showing each layer in the configuration it would have after being disposed over the preceding surface. FIG. 4 shows top plan view of inductive member 14 having a plurality of terminal receiving apertures 22 extending therethrough. Apertures 22 are dimensioned to loosely receive electrical terminal members 48 as shown in FIG. 9. Preferably, inductive member 14 is a ferrite material. FIG. 5 illustrates the pattern of a first conductive layer 24 disposed on surface 16 of inductive member 14 (shown in phantom). The coating of electrically-conductive material is disposed first at selected locations on the upper and lower surfaces 16, 18 and preferably along all the surfaces of outside edges 20. Conductive layer 24 is spaced from respective apertures 22 to provide exposed surface portions 26 of surfaces 16, 18. Conductive layer 24 includes the ground electrode portions 25 for the pi-network filter assembly 12 and ground conductive areas 27 along outside edges 20 as best seen in FIG. 1.

A layer 30 of dielectric material is then disposed over first electrically-conductive layer 24 on surfaces 16 and 18. As can be seen in FIGS. 1 and 6, dielectric layer 30 extends over the ground electrode portions 25 and completely surrounds each aperture 22. Preferably layer 30 is disposed over the entire surfaces 16, 18 with the exception of the peripheral edge 28 of coated substrate 14, thus leaving the ground conductor layer 24 exposed along the peripheral edge 17 of upper surface 16 as shown in FIG. 3 and the corresponding peripheral edge of lower surface 18 (not shown) as well as outside edges 20. Dielectric layer 30 also extends over exposed surface portions 26 (shown in phantom) and also shown in FIGS. 1 and 9.

A second electrically conductive layer 36 is disposed on dielectric layer 30 at isolated second selected locations along upper and lower surfaces 16, 18 as seen in FIG. 7. Each isolated portion 31 of conductive layer 36 includes a conductive contact pad comprising a signal electrode 38 immediately surrounding each aperture 22. Portions 34 of dielectric layer 30 are exposed between the isolated portions 37 of second conductive layer 36. As seen in FIG. 1 the second conductive layer 36 extends toward the peripheral edge 32 of dielectric layer 30 but is spaced therefrom, thus insulating second conductive pads 38 from ground electrode layer 24, which extends around the peripheral edge 28 of inductive member 14. In addition, the upper and lower surfaces 16, 18 may be further coated with a layer 40 of dielectric environmental sealing material as shown in FIG. 8 to seal all but the contact pad areas 38 immediately surrounding apertures 22 and peripheral area 28 as seen in FIGS. 1 and 8. FIG. 1 illustrates the shape of the cured sealant material layer 40 on the top surface of assembly 12. The sealant material extends at 41 to the peripheral edge 32 of dielectric layer 30 thus leaving ground electrode 24 exposed along the peripheral edge and along outside edges 20. The combination of ground electrode portions 25, dielectric layer 30 and conductive pad 38 at the areas immediately surrounding each aperture 22 forms capacitors 44, 46 at respective ends of each aperture as best seen in FIGS. 2 and 9. The combination, thus forms a pi-network assembly having capacitor-inductor-capacitor represented schematically in FIG. 10. The respective upper and lower capacitor members 44, 46 are electrically and mechanically engaged with electrical terminal members 48 inserted through respective apertures 22 as seen in FIG. 9. Solder 50 provides electrical interconnection of the capacitive and inductive elements to terminal 48 and mechanically secures the planar assembly 12 to terminal members 48.

The construction of the preferred embodiment of the invention as disclosed herein includes forming respective pairs of capacitors 48, 46 on opposed surfaces of a planar ferrite member 14. The inductance capacity of the ferrite member 14 may be changed by altering the composition and thickness of the ferrite member. Preferably the ferrite member 14 should be in the range of 0.040–0.250 inches thick. The ferrite material provides mechanical support for the capacitors. The apertures 22 extending through the ferrite member should be slightly greater than the diameter of the pin terminal member 48 so as not to damage the ferrite member 14 when the terminal member 48 is inserted through the aperture 22. Ferrite materials having various inductive properties are commercially available. In selecting the ferrite material, the insertion loss versus inductance and thickness of the ferrite must be balanced with the capacitance of respective capacitors.

The value of the capacitance of the respective capacitors may be varied by varying the type of dielectric material employed. A number of dielectric materials are commercially available. Preferably the dielectric material is sintered to the surface of the planar member. The thickness of the dielectric material is preferably 0.002 inches. Furthermore, with respect to the inductors, it should be understood that the amount of inductance can be varied by the composition of the material used in the planar member 14 and by varying the thickness of the planar member. It is also to be understood that the pin terminal member is used as a representative sample only and that other configurations of electrical contact terminals may also be used. The pi-network filter assembly 12 as disclosed herein may be used in a variety of electrical connectors and other filtering applications. The invention provides a more cost effective means for manufacturing pi-network filter assembly than heretofore possible.

A number of conductive materials may be used for the conductive layers. Preferably the material is a screen printable conductive ink comprising a composite of paladium-silver or other known conductive inks. It is important that the melting point of the conductive ink of the first conductive layer 24 be greater than the sintering temperature used to cure the dielectric material 30, typically 850 degrees centigrade. Since the second layer 36 of conductive material is applied to the sintered dielectric layer, the melting point of the conductive material for the second layer 36 need not be as high as that of the first layer 24. To minimize the number of materials used, the same material may be used for both the first and second conductive layers 24, 26. It is essential, however, that the conductive ink be able to withstand the soldering temperatures when the electrical terminal member 48 is soldered to the conductive pad 38 formed by the second conductive layer 36. The conductive layer should be of a high temperature conductive ink, preferably with a noble metal conductive particles and capable of being soldered. The thickness of the conductive layers 24, 26 can be preferably as varied from 0.0005-0.001 inches thick.

In selecting an environmental sealant material 40, the material needs to be compatible with the soldering temperatures so as not to melt during the soldering process. A number of environmental sealed materials are readily available on the market. The thickness of the environmental seal is from 0.002-0.003 inches thick.

In the drawings and specifications, there have been set forth preferred embodiments of the invention and although specific terms are employed therein, they are used in generic and descriptive sense, and not for purposes of limitation.

I claim:

1. A planar filter assembly comprising:
   a generally planar inductive member having upper and lower surfaces and a plurality of apertures for receiving electrical terminal members therethrough, said apertures extending between said surfaces;
   first electrically conductive layers respectively disposed on first selected locations of said upper and lower surfaces, said first conductive layers being spaced from respective ends of said apertures to provide respective exposed upper and lower surface portions about said apertures, said first conductive layers on said respective upper and lower surfaces being adapted to be electrically engageable with grounding means;
   dielectric layers respectively disposed on said first conductive layers and extending over said exposed upper and lower surface portions about said apertures; and
   second electrically conductive layers respectively disposed on isolated second selected locations on said dielectric layers and extending to respective ends of said apertures and overlying respective said dielectric layers thereby forming respective conductive pad portions surrounding said ends of said apertures, each said pad portion being capable of being electrically engaged with an electrical terminal member upon insertion thereof into the aperture associated with said pad portion;
   said first conductive layers, dielectric layers and second conductive layers thus forming a plurality of respective pairs of upper and lower capacitors, one capacitor pair being formed at respective ends of each said aperture;
   whereby each respective pair of capacitors and said inductive member therebetween forms a pi-network filter with an electrical terminal member upon insertion thereof into said aperture associated therewith.

2. The planar filter assembly as described in claim 1 wherein said planar inductive member is a ferrite material.

3. The planar filter assembly as described in claim 1 further including further dielectric layers respectively disposed on selected portions of said second conductive layers and being of an environmental sealant material.

4. The planar filter assembly as described in claim 1 wherein said conductive layers are screen printable conductive inks.

5. The planar filter assembly as described in claim 1 further comprising a plurality of electrical terminal members, said terminals being disposed in respective ones of said plurality of terminal receiving apertures, and means for mechanically securing and electrically engaging each said terminal member with a said pair of capacitors formed at respective ends of said aperture in which said terminal member is disposed.

6. The planar filter assembly as described in claim 5 wherein said means for mechanically securing said terminal members in said aperture and electrically engaging said members with corresponding pairs of capacitors is solder.

7. A method for making a planar pi-network filter assembly including a planar inductive member receiving apertures extending therethrough, the method comprising the steps of:
   disposing respective first electrically conductive layers on first selected locations of respective upper and lower surfaces of said planar inductive member;
   spacing said respective first conductive layers from respective ends of said apertures to provide respective exposed upper and lower surface portions about said ends of said apertures;

disposing respective dielectric layers on said first upper and lower conductive layers such that said dielectric layers overlie said exposed upper and lower surface portions about said apertures; and disposing respective second electrically conductive layers on isolated second selected locations on said dielectric layers such that said second conductive layers overlie said dielectric layers about respective ones of said apertures and forms respective conductive pad portions surrounding said ends of said apertures;

whereby said respective first conductive layers, dielectric layers and second conductive layers form a plurality of respective pairs of upper and lower capacitors, one capacitor pair being formed at respective ends of each said aperture, each respective pair of capacitors and said inductive member therebetween thus forming a pi-network filter with an electrical terminal member upon insertion thereof into said aperture associated therewith.

8. The method of making the planar filter assembly as described in claim 7 further including the step of disposing an environmental sealant material on selected portions of said respective second conductive layers such that at least a part of respective ones of said conductive pad portions remain exposed for subsequent electrical connection to electrical terminal members.

9. The method of making the planar filter assembly as described in claim 7 further including the steps of disposing an electrical terminal member in a respective one of said apertures of said planar member; mechanically securing said terminal member in said aperture; and electrically engaging said terminal member with its respective pair of capacitors.

10. The method of making the planar filter assembly as described in claim 7 wherein at least one of said first and second conductive layers are formed by using screen printable conductive inks.

* * * * *

UNITED STATES PATENT OFFICE
CERTIFICATE OF CORRECTION

Patent No. 4,853,659            Dated August 1, 1989

Inventor(s) John P. Kling

It is certified that error appears in the above-identified patent and that said Letters Patent is hereby corrected as shown below:

<u>In the Abstract</u>

Line 11, insert --14-- after "member".

Line 19, change "24" to "30".

Signed and Sealed this

Thirty-first Day of July, 1990

Attest:

HARRY F. MANBECK, JR.

*Attesting Officer*         *Commissioner of Patents and Trademarks*